United States Patent
Gleason et al.

(10) Patent No.: US 7,518,387 B2
(45) Date of Patent: *Apr. 14, 2009

(54) SHIELDED PROBE FOR TESTING A DEVICE UNDER TEST

(75) Inventors: K. Reed Gleason, Portland, OR (US); Tim Lesher, Portland, OR (US); Eric W. Strid, Portland, OR (US); Mike Andrews, Cornelius, OR (US); John Martin, Portland, OR (US); John Dunklee, Tigard, OR (US); Leonard Hayden, Beaverton, OR (US); Amr M. E. Safwat, Cairo (EG)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/906,055

(22) Filed: Sep. 27, 2007

(65) Prior Publication Data

US 2008/0024149 A1   Jan. 31, 2008

Related U.S. Application Data

(63) Continuation of application No. 11/607,398, filed on Dec. 1, 2006, now Pat. No. 7,304,488, which is a continuation of application No. 10/848,777, filed on May 18, 2004, now Pat. No. 7,161,363, which is a continuation of application No. 10/445,099, filed on May 23, 2003, now Pat. No. 6,815,963.

(60) Provisional application No. 60/383,017, filed on May 23, 2002.

(51) Int. Cl.
  *G01R 31/02* (2006.01)
(52) U.S. Cl. .................................... 324/754; 324/762
(58) Field of Classification Search .................. None
See application file for complete search history.

(56) References Cited

U.S. PATENT DOCUMENTS

| 491,783 | A | 5/1893 | Moyer |
| 1,337,866 | A | 4/1920 | Whitacker |
| 2,142,625 | A | 1/1939 | Zoethout |
| 2,376,101 | A | 5/1945 | Tyzzer |
| 2,389,668 | A | 11/1945 | Johnson |
| 2,545,258 | A | 3/1951 | Cailloux |
| 2,762,234 | A | 9/1956 | Dodd |
| 2,901,696 | A | 8/1959 | Möllfors |

(Continued)

FOREIGN PATENT DOCUMENTS

CH   607 045   11/1978

(Continued)

OTHER PUBLICATIONS

Cohn, S, "Properties of Ridge Wave Guide, " Proceedings of the I.R.E., Aug. 1947, pp. 783-788.

(Continued)

*Primary Examiner*—Vinh P Nguyen
(74) *Attorney, Agent, or Firm*—Chernoff, Vilhauer, McClung & Stenzel

(57) ABSTRACT

A probe measurement system for measuring the electrical characteristics of integrated circuits or other microelectronic devices at high frequencies.

55 Claims, 7 Drawing Sheets

U.S. PATENT DOCUMENTS

| | | |
|---|---|---|
| 2,921,276 A | 1/1960 | Fubini |
| 3,176,091 A | 3/1965 | Hanson et al. |
| 3,193,712 A | 7/1965 | Harris |
| 3,218,584 A | 11/1965 | Ayer |
| 3,230,299 A | 1/1966 | Radziekowski |
| 3,262,593 A | 7/1966 | Hainer |
| 3,396,598 A | 8/1968 | Grispo |
| 3,401,126 A | 9/1968 | Miller et al. |
| 3,429,040 A | 2/1969 | Miller |
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Frosch et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder, Jr. et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |

| | | | | | | |
|---|---|---|---|---|---|---|
| 4,705,447 A | 11/1987 | Smith | | 4,972,073 A | 11/1990 | Lessing |
| 4,706,050 A | 11/1987 | Andrews | | 4,975,638 A | 12/1990 | Evans et al. |
| 4,707,657 A | 11/1987 | Bøegh-Petersen | | 4,980,637 A | 12/1990 | Huff et al. |
| 4,711,563 A | 12/1987 | Lass | | 4,980,638 A | 12/1990 | Dermon et al. |
| 4,713,347 A | 12/1987 | Mitchell et al. | | 4,983,910 A | 1/1991 | Majidi-Ahy et al. |
| 4,714,873 A | 12/1987 | McPherson et al. | | 4,987,100 A | 1/1991 | McBride et al. |
| 4,722,846 A | 2/1988 | Abe et al. | | 4,988,062 A | 1/1991 | London |
| 4,725,793 A | 2/1988 | Igarashi | | 4,991,290 A | 2/1991 | MacKay |
| 4,727,319 A | 2/1988 | Shahriary | | 4,998,062 A | 3/1991 | Ikeda |
| 4,727,391 A | 2/1988 | Tajima et al. | | 4,998,063 A | 3/1991 | Miller |
| 4,727,637 A | 3/1988 | Buckwitz et al. | | 5,001,423 A | 3/1991 | Abrami et al. |
| 4,734,641 A | 3/1988 | Byrd, Jr. et al. | | 5,003,253 A | 3/1991 | Majidi-Ahy et al. |
| 4,739,259 A | 4/1988 | Hadwin et al. | | 5,012,186 A | 4/1991 | Gleason |
| 4,740,764 A | 4/1988 | Gerlack | | 5,020,219 A | 6/1991 | Leedy |
| 4,742,571 A | 5/1988 | Letron | | 5,021,186 A | 6/1991 | Ota et al. |
| 4,744,041 A | 5/1988 | Strunk et al. | | 5,030,907 A | 7/1991 | Yih et al. |
| 4,746,857 A | 5/1988 | Sakai et al. | | 5,041,782 A | 8/1991 | Marzan |
| 4,749,942 A | 6/1988 | Sang et al. | | 5,045,781 A | 9/1991 | Gleason et al. |
| 4,754,239 A | 6/1988 | Sedivec | | 5,059,898 A | 10/1991 | Barsotti et al. |
| 4,755,742 A | 7/1988 | Agoston et al. | | 5,061,192 A | 10/1991 | Chapin et al. |
| 4,755,746 A | 7/1988 | Mallory et al. | | 5,061,823 A | 10/1991 | Carroll |
| 4,755,747 A | 7/1988 | Sato | | 5,062,628 A | 11/1991 | Heyn et al. |
| 4,755,872 A | 7/1988 | Bestler et al. | | 5,066,357 A | 11/1991 | Smyth, Jr. et al. |
| 4,755,874 A | 7/1988 | Esrig et al. | | 5,069,628 A | 12/1991 | Crumly |
| 4,757,255 A | 7/1988 | Margozzi | | 5,082,627 A | 1/1992 | Stanbro |
| 4,764,723 A | 8/1988 | Strid | | 5,084,671 A | 1/1992 | Miyata et al. |
| 4,766,384 A | 8/1988 | Kleinberg et al. | | 5,089,774 A | 2/1992 | Nakano |
| 4,772,846 A | 9/1988 | Reeds | | 5,091,692 A | 2/1992 | Ohno et al. |
| 4,780,670 A | 10/1988 | Cherry | | 5,091,732 A | 2/1992 | Mileski et al. |
| 4,783,625 A | 11/1988 | Harry et al. | | 5,095,891 A | 3/1992 | Reitter |
| 4,788,851 A | 12/1988 | Brault | | 5,097,101 A | 3/1992 | Trobough |
| 4,791,363 A | 12/1988 | Logan | | 5,097,207 A | 3/1992 | Blanz |
| 4,793,814 A | 12/1988 | Zifcak et al. | | 5,101,453 A | 3/1992 | Rumbaugh |
| 4,795,962 A | 1/1989 | Yanagawa et al. | | 5,107,076 A | 4/1992 | Bullock et al. |
| 4,805,627 A | 2/1989 | Klingenbeck et al. | | 5,116,180 A | 5/1992 | Fung et al. |
| 4,810,981 A | 3/1989 | Herstein | | 5,126,286 A | 6/1992 | Chance |
| 4,812,754 A | 3/1989 | Tracy et al. | | 5,126,696 A | 6/1992 | Grote et al. |
| 4,818,059 A | 4/1989 | Kakii et al. | | 5,133,119 A | 7/1992 | Afshari et al. |
| 4,827,211 A | 5/1989 | Strid et al. | | 5,134,365 A | 7/1992 | Okubo et al. |
| 4,831,494 A | 5/1989 | Arnold et al. | | 5,136,237 A | 8/1992 | Smith et al. |
| 4,835,495 A | 5/1989 | Simonutti | | 5,138,289 A | 8/1992 | McGrath |
| 4,837,507 A | 6/1989 | Hechtman | | 5,142,224 A | 8/1992 | Smith et al. |
| 4,839,587 A | 6/1989 | Flatley et al. | | 5,145,552 A | 9/1992 | Yoshizawa et al. |
| 4,849,689 A | 7/1989 | Gleason et al. | | 5,148,131 A | 9/1992 | Amboss et al. |
| 4,853,624 A | 8/1989 | Rabjohn | | 5,159,264 A | 10/1992 | Anderson |
| 4,853,627 A | 8/1989 | Gleason et al. | | 5,159,267 A | 10/1992 | Anderson |
| 4,858,160 A | 8/1989 | Strid et al. | | 5,159,752 A | 11/1992 | Mahant-Shetti et al. |
| 4,859,989 A | 8/1989 | McPherson | | 5,160,883 A | 11/1992 | Blanz |
| 4,864,227 A | 9/1989 | Sato | | 5,164,319 A | 11/1992 | Hafeman et al. |
| 4,871,883 A | 10/1989 | Guiol | | 5,166,606 A | 11/1992 | Blanz |
| 4,871,964 A | 10/1989 | Boll et al. | | 5,172,049 A | 12/1992 | Kiyokawa et al. |
| 4,888,550 A | 12/1989 | Reid | | 5,172,050 A | 12/1992 | Swapp |
| 4,891,584 A | 1/1990 | Kamieniecki et al. | | 5,172,051 A | 12/1992 | Zamborelli |
| 4,893,914 A | 1/1990 | Hancock et al. | | 5,177,438 A | 1/1993 | Littlebury et al. |
| 4,894,612 A | 1/1990 | Drake et al. | | 5,180,977 A | 1/1993 | Huff |
| 4,899,126 A | 2/1990 | Yamada | | 5,187,443 A | 2/1993 | Bereskin |
| 4,899,998 A | 2/1990 | Feramachi | | 5,198,752 A | 3/1993 | Miyata et al. |
| 4,901,012 A | 2/1990 | Gloanec et al. | | 5,198,753 A | 3/1993 | Hamburgen |
| 4,904,933 A | 2/1990 | Snyder et al. | | 5,202,558 A | 4/1993 | Barker |
| 4,904,935 A | 2/1990 | Calma et al. | | 5,202,648 A | 4/1993 | McCandless |
| 4,906,920 A | 3/1990 | Huff et al. | | 5,207,585 A | 5/1993 | Byrnes et al. |
| 4,908,570 A | 3/1990 | Gupta et al. | | 5,214,243 A | 5/1993 | Johnson |
| 4,912,399 A | 3/1990 | Greub et al. | | 5,214,374 A | 5/1993 | St. Onge |
| 4,916,002 A | 4/1990 | Carver | | 5,225,037 A | 7/1993 | Elder et al. |
| 4,916,398 A | 4/1990 | Rath | | 5,227,730 A | 7/1993 | King et al. |
| 4,918,373 A | 4/1990 | Newberg | | 5,232,789 A | 8/1993 | Platz et al. |
| 4,918,383 A | 4/1990 | Huff et al. | | 5,233,197 A | 8/1993 | Bowman et al. |
| 4,922,128 A | 5/1990 | Dhong et al. | | 5,233,306 A | 8/1993 | Misra |
| 4,922,186 A | 5/1990 | Tsuchiya et al. | | 5,245,292 A | 9/1993 | Milesky et al. |
| 4,922,912 A | 5/1990 | Watanabe | | 5,266,889 A | 11/1993 | Harwood et al. |
| 4,926,172 A | 5/1990 | Gorsek | | 5,266,963 A | 11/1993 | Carter |
| 4,929,893 A | 5/1990 | Sato et al. | | 5,267,088 A | 11/1993 | Nomura |
| 4,970,386 A | 11/1990 | Buck | | 5,270,664 A | 12/1993 | McMurtry et al. |

| Patent | Date | Inventors |
|---|---|---|
| 5,274,336 A | 12/1993 | Crook et al. |
| 5,280,156 A | 1/1994 | Niori et al. |
| 5,289,117 A | 2/1994 | Van Loan et al. |
| 5,293,175 A | 3/1994 | Hemmie et al. |
| 5,298,972 A | 3/1994 | Heffner |
| 5,304,924 A | 4/1994 | Yamano et al. |
| 5,313,157 A | 5/1994 | Pasiecznik, Jr. |
| 5,315,237 A | 5/1994 | Iwakura et al. |
| 5,316,435 A | 5/1994 | Mozingo |
| 5,317,656 A | 5/1994 | Moslehi et al. |
| 5,321,352 A | 6/1994 | Takebuchi |
| 5,321,453 A | 6/1994 | Mori et al. |
| 5,326,412 A | 7/1994 | Schreiber et al. |
| 5,334,931 A | 8/1994 | Clarke et al. |
| 5,347,204 A | 9/1994 | Gregory et al. |
| 5,355,079 A | 10/1994 | Evans et al. |
| 5,357,211 A | 10/1994 | Bryson et al. |
| 5,360,312 A | 11/1994 | Mozingo |
| 5,361,049 A | 11/1994 | Rubin et al. |
| 5,363,050 A | 11/1994 | Guo et al. |
| 5,367,165 A | 11/1994 | Toda et al. |
| 5,369,368 A | 11/1994 | Kassen et al. |
| 5,371,654 A | 12/1994 | Beaman et al. |
| 5,373,231 A | 12/1994 | Boll et al. |
| 5,374,938 A | 12/1994 | Hatazawa et al. |
| 5,376,790 A | 12/1994 | Linker et al. |
| 5,383,787 A | 1/1995 | Switky et al. |
| 5,389,885 A | 2/1995 | Swart |
| 5,395,253 A | 3/1995 | Crumly |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,430,813 A | 7/1995 | Anderson et al. |
| 5,441,690 A | 8/1995 | Ayala-Esquilin et al. |
| 5,451,884 A | 9/1995 | Sauerland |
| 5,453,404 A | 9/1995 | Leedy |
| 5,457,398 A | 10/1995 | Schwindt et al. |
| 5,463,324 A | 10/1995 | Wardwell et al. |
| 5,467,024 A | 11/1995 | Swapp |
| 5,469,324 A | 11/1995 | Henderson et al. |
| 5,475,316 A | 12/1995 | Hurley et al. |
| 5,476,211 A | 12/1995 | Khandros |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,488,954 A | 2/1996 | Sleva et al. |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,507,652 A | 4/1996 | Wardwell |
| 5,510,792 A | 4/1996 | Ono et al. |
| 5,511,010 A | 4/1996 | Burns |
| 5,512,835 A | 4/1996 | Rivera et al. |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,527,372 A | 6/1996 | Voisine et al. |
| 5,528,158 A | 6/1996 | Sinsheimer et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,537,372 A | 7/1996 | Albrecht et al. |
| 5,539,323 A | 7/1996 | Davis, Jr. |
| 5,539,676 A | 7/1996 | Yamaguchi |
| 5,550,481 A | 8/1996 | Holmes et al. |
| 5,561,378 A | 10/1996 | Bockelman et al. |
| 5,565,788 A * | 10/1996 | Burr et al. .................. 324/762 |
| 5,565,881 A | 10/1996 | Phillips et al. |
| 5,569,591 A | 10/1996 | Kell et al. |
| 5,571,324 A | 11/1996 | Sago et al. |
| 5,578,932 A | 11/1996 | Adamian |
| 5,583,445 A | 12/1996 | Mullen |
| 5,584,120 A | 12/1996 | Roberts |
| 5,584,608 A | 12/1996 | Gillespie |
| 5,589,781 A | 12/1996 | Higgins et al. |
| 5,594,358 A | 1/1997 | Ishikawa et al. |
| 5,600,256 A | 2/1997 | Woith et al. |
| 5,601,740 A | 2/1997 | Eldridge et al. |
| 5,610,529 A | 3/1997 | Schwindt |
| 5,611,008 A | 3/1997 | Yap |
| 5,617,035 A | 4/1997 | Swapp |
| 5,621,333 A | 4/1997 | Long et al. |
| 5,621,400 A | 4/1997 | Corbi |
| 5,623,213 A | 4/1997 | Liu et al. |
| 5,623,214 A | 4/1997 | Pasiecznik, Jr. |
| 5,627,473 A | 5/1997 | Takani |
| 5,628,057 A | 5/1997 | Phillips et al. |
| 5,629,838 A | 5/1997 | Knight et al. |
| 5,631,571 A | 5/1997 | Spaziani et al. |
| 5,633,780 A | 5/1997 | Cronin |
| 5,635,846 A | 6/1997 | Beaman et al. |
| 5,642,298 A | 6/1997 | Mallory et al. |
| 5,644,248 A | 7/1997 | Fujimoto |
| 5,653,939 A | 8/1997 | Hollis et al. |
| 5,656,942 A | 8/1997 | Watts et al. |
| 5,659,421 A | 8/1997 | Rahmel et al. |
| 5,666,063 A | 9/1997 | Abercrombie et al. |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,678,210 A | 10/1997 | Hannah |
| 5,685,232 A | 11/1997 | Inoue |
| 5,686,317 A | 11/1997 | Akram et al. |
| 5,686,960 A | 11/1997 | Sussman et al. |
| 5,688,618 A | 11/1997 | Hulderman et al. |
| 5,700,844 A | 12/1997 | Hederick et al. |
| 5,704,355 A | 1/1998 | Bridges |
| 5,715,819 A | 2/1998 | Svenson et al. |
| 5,720,098 A | 2/1998 | Kister |
| 5,723,347 A | 3/1998 | Kirano et al. |
| 5,726,211 A | 3/1998 | Hedrick et al. |
| 5,728,091 A | 3/1998 | Payne et al. |
| 5,729,150 A | 3/1998 | Schwindt |
| 5,731,920 A | 3/1998 | Katsuragawa |
| 5,742,174 A | 4/1998 | Kister et al. |
| 5,744,971 A | 4/1998 | Chan et al. |
| 5,748,506 A | 5/1998 | Bockelman |
| 5,751,153 A | 5/1998 | Bockelman |
| 5,751,252 A | 5/1998 | Phillips |
| 5,756,021 A | 5/1998 | Bedrick et al. |
| 5,756,908 A | 5/1998 | Knollmeyer et al. |
| 5,764,070 A | 6/1998 | Pedder |
| 5,767,690 A | 6/1998 | Fujimoto |
| 5,772,451 A | 6/1998 | Dozier, II et al. |
| 5,773,780 A | 6/1998 | Eldridge et al. |
| 5,777,485 A | 7/1998 | Tanaka et al. |
| 5,785,538 A | 7/1998 | Beaman et al. |
| 5,792,668 A | 8/1998 | Fuller et al. |
| 5,793,213 A | 8/1998 | Bockelman et al. |

| | | |
|---|---|---|
| 5,794,133 A | 8/1998 | Kashima |
| 5,803,607 A | 9/1998 | Jones et al. |
| 5,804,607 A | 9/1998 | Hedrick et al. |
| 5,804,982 A | 9/1998 | Lo et al. |
| 5,804,983 A | 9/1998 | Nakajima et al. |
| 5,806,181 A | 9/1998 | Khandros et al. |
| 5,807,107 A | 9/1998 | Bright et al. |
| 5,810,607 A | 9/1998 | Shih et al. |
| 5,811,751 A | 9/1998 | Leona et al. |
| 5,811,982 A | 9/1998 | Beaman et al. |
| 5,813,847 A | 9/1998 | Eroglu et al. |
| 5,814,847 A | 9/1998 | Shihadeh et al. |
| 5,820,014 A | 10/1998 | Dozier, II et al. |
| 5,821,763 A | 10/1998 | Beaman et al. |
| 5,824,494 A | 10/1998 | Feldberg |
| 5,829,128 A | 11/1998 | Eldridge et al. |
| 5,829,437 A | 11/1998 | Bridges |
| 5,831,442 A | 11/1998 | Heigl |
| 5,832,601 A | 11/1998 | Eldridge et al. |
| 5,833,601 A | 11/1998 | Swartz et al. |
| 5,838,160 A | 11/1998 | Beaman et al. |
| 5,841,288 A | 11/1998 | Meaney et al. |
| 5,841,342 A | 11/1998 | Hegmann et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,852,871 A | 12/1998 | Khandros |
| 5,854,608 A | 12/1998 | Leisten |
| 5,864,946 A | 2/1999 | Eldridge et al. |
| 5,867,073 A | 2/1999 | Weinreb et al. |
| 5,869,326 A | 2/1999 | Hofmann |
| 5,869,974 A | 2/1999 | Akram et al. |
| 5,874,361 A | 2/1999 | Collins et al. |
| 5,876,082 A | 3/1999 | Kempf et al. |
| 5,878,486 A | 3/1999 | Eldridge et al. |
| 5,879,289 A | 3/1999 | Yarush et al. |
| 5,883,522 A | 3/1999 | O'Boyle |
| 5,883,523 A | 3/1999 | Ferland et al. |
| 5,884,398 A | 3/1999 | Eldridge et al. |
| 5,888,075 A | 3/1999 | Hasegawa et al. |
| 5,892,539 A | 4/1999 | Colvin |
| 5,896,038 A | 4/1999 | Budnaitis et al. |
| 5,900,737 A | 5/1999 | Graham et al. |
| 5,900,738 A | 5/1999 | Khandros et al. |
| 5,903,143 A | 5/1999 | Mochizuki et al. |
| 5,905,421 A | 5/1999 | Oldfield |
| 5,910,727 A | 6/1999 | Fujihara et al. |
| 5,912,046 A | 6/1999 | Eldridge et al. |
| 5,914,613 A | 6/1999 | Gleason et al. |
| 5,914,614 A | 6/1999 | Beaman et al. |
| 5,916,689 A | 6/1999 | Collins et al. |
| 5,917,707 A | 6/1999 | Khandros et al. |
| 5,923,180 A | 7/1999 | Botka et al. |
| 5,926,029 A | 7/1999 | Ference et al. |
| 5,926,951 A | 7/1999 | Khandros et al. |
| 5,940,965 A | 8/1999 | Uhling et al. |
| 5,944,093 A | 8/1999 | Viswanath |
| 5,945,836 A | 8/1999 | Sayre et al. |
| 5,949,383 A | 9/1999 | Hayes et al. |
| 5,949,579 A | 9/1999 | Baker |
| 5,959,461 A | 9/1999 | Brown et al. |
| 5,963,364 A | 10/1999 | Leong et al. |
| 5,966,645 A | 10/1999 | Davis |
| 5,970,429 A | 10/1999 | Martin |
| 5,973,504 A | 10/1999 | Chong |
| 5,974,662 A | 11/1999 | Eldridge et al. |
| 5,977,783 A | 11/1999 | Takayama et al. |
| 5,981,268 A | 11/1999 | Kovacs et al. |
| 5,982,166 A | 11/1999 | Mautz |
| 5,983,493 A | 11/1999 | Eldridge et al. |
| 5,993,611 A | 11/1999 | Moroney, III et al. |
| 5,994,152 A | 11/1999 | Khandros et al. |
| 5,995,914 A | 11/1999 | Cabot |
| 5,996,102 A | 11/1999 | Haulin |
| 5,998,228 A | 12/1999 | Eldridge et al. |
| 5,998,768 A | 12/1999 | Hunter et al. |
| 5,998,864 A | 12/1999 | Khandros et al. |
| 5,999,268 A | 12/1999 | Yonezawa et al. |
| 6,001,760 A | 12/1999 | Katsuda et al. |
| 6,002,426 A | 12/1999 | Back et al. |
| 6,006,002 A | 12/1999 | Motok et al. |
| 6,013,586 A | 1/2000 | McGhee et al. |
| 6,019,612 A | 2/2000 | Hasegawa et al. |
| 6,023,103 A | 2/2000 | Chang et al. |
| 6,028,435 A | 2/2000 | Nikawa |
| 6,029,344 A | 2/2000 | Khandros et al. |
| 6,031,383 A | 2/2000 | Streib et al. |
| 6,032,356 A | 3/2000 | Eldridge et al. |
| 6,032,714 A | 3/2000 | Fenton |
| 6,033,935 A | 3/2000 | Dozier, II et al. |
| 6,034,533 A | 3/2000 | Tervo et al. |
| 6,037,785 A | 3/2000 | Higgins |
| 6,040,739 A | 3/2000 | Wedeen et al. |
| 6,042,712 A | 3/2000 | Mathieu |
| 6,043,563 A | 3/2000 | Eldridge et al. |
| 6,046,599 A | 4/2000 | Long et al. |
| 6,049,216 A | 4/2000 | Yang et al. |
| 6,049,976 A | 4/2000 | Khandros |
| 6,050,829 A | 4/2000 | Eldridge et al. |
| 6,051,422 A | 4/2000 | Kovacs et al. |
| 6,052,653 A | 4/2000 | Mazur et al. |
| 6,054,651 A | 4/2000 | Fogel et al. |
| 6,054,869 A | 4/2000 | Hutton et al. |
| 6,059,982 A | 5/2000 | Palagonia et al. |
| 6,060,888 A | 5/2000 | Blackham et al. |
| 6,060,892 A | 5/2000 | Yamagata |
| 6,061,589 A | 5/2000 | Bridges et al. |
| 6,062,879 A | 5/2000 | Beaman et al. |
| 6,064,213 A | 5/2000 | Khandros et al. |
| 6,064,217 A | 5/2000 | Smith |
| 6,064,218 A | 5/2000 | Godfrey et al. |
| 6,066,911 A | 5/2000 | Lindemann et al. |
| 6,071,009 A | 6/2000 | Clyne |
| 6,078,183 A | 6/2000 | Cole, Jr. |
| 6,078,500 A | 6/2000 | Beaman et al. |
| 6,090,261 A | 7/2000 | Mathieu |
| 6,091,236 A | 7/2000 | Piety et al. |
| 6,091,255 A | 7/2000 | Godfrey |
| 6,091,256 A | 7/2000 | Long et al. |
| 6,096,561 A | 8/2000 | Tayi |
| 6,096,567 A | 8/2000 | Kaplan et al. |
| 6,100,815 A | 8/2000 | Pailthorp |
| 6,104,201 A | 8/2000 | Beaman et al. |
| 6,104,206 A | 8/2000 | Verkull |
| 6,110,823 A | 8/2000 | Eldridge et al. |
| 6,114,864 A | 9/2000 | Soejima et al. |
| 6,114,865 A | 9/2000 | Lagowski et al. |
| 6,118,287 A | 9/2000 | Boll et al. |
| 6,118,894 A | 9/2000 | Schwartz et al. |
| 6,121,836 A | 9/2000 | Vallencourt |
| 6,124,725 A | 9/2000 | Sato |
| 6,127,831 A | 10/2000 | Khoury et al. |
| 6,130,536 A | 10/2000 | Powell et al. |
| 6,137,302 A | 10/2000 | Schwindt |
| 6,144,212 A | 11/2000 | Mizuta |
| 6,146,908 A | 11/2000 | Falque et al. |
| 6,147,502 A | 11/2000 | Fryer et al. |
| 6,147,851 A | 11/2000 | Anderson |
| 6,150,186 A | 11/2000 | Chen et al. |
| 6,160,407 A | 12/2000 | Nikawa |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |

| | | |
|---|---|---|
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penney et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B1 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |

| | | |
|---|---|---|
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros, Jr. et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,359 B1 | 3/2005 | Sekel |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |

| Patent | Date | Inventor |
|---|---|---|
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Altmann et al. |
| 6,944,380 B1 | 9/2005 | Hideo et al. |
| 6,946,375 B2 | 9/2005 | Hattori et al. |
| 6,946,859 B2 | 9/2005 | Karavakis et al. |
| 6,946,860 B2 | 9/2005 | Cheng et al. |
| 6,946,864 B2 | 9/2005 | Gramann et al. |
| 6,948,391 B2 | 9/2005 | Brassell et al. |
| 6,948,981 B2 | 9/2005 | Pade |
| 6,949,942 B2 | 9/2005 | Eldridge et al. |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,057,404 B2 | 6/2006 | Gleason et al. |
| 7,071,722 B2 | 7/2006 | Yamada et al. |
| 7,088,981 B2 | 8/2006 | Chang |
| 7,096,133 B1 | 8/2006 | Martin et al. |
| 7,161,363 B2 | 1/2007 | Gleason et al. |
| 7,173,433 B2 | 2/2007 | Hoshi et al. |
| 7,187,188 B2 | 3/2007 | Andrews et al. |
| 7,188,037 B2 | 3/2007 | Hidehira |
| 7,219,416 B2 | 5/2007 | Inoue et al. |
| 7,233,160 B2 | 6/2007 | Hayden et al. |
| 7,271,603 B2 | 9/2007 | Gleason et al. |
| 7,276,922 B2 | 10/2007 | Miller et al. |
| 7,315,175 B2 | 1/2008 | Cole |
| 7,319,335 B2 | 1/2008 | Brunner et al. |
| 7,319,337 B2 | 1/2008 | Sakata |
| 7,323,680 B2 | 1/2008 | Chong |
| 7,323,899 B2 | 1/2008 | Schuette et al. |
| 7,327,153 B2 | 2/2008 | Weinraub |
| 7,332,918 B2 | 2/2008 | Sigiyama et al. |
| 7,332,923 B2 | 2/2008 | Schott et al. |
| 7,342,402 B2 | 3/2008 | Kim et al. |
| 7,403,028 B2 | 7/2008 | Campbell |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montonya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0109088 A1 | 8/2002 | Nara et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |

| | | |
|---|---|---|
| 2002/0197709 A1 | 12/2002 | van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | Van Veen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gundersen et al. |
| 2003/0184332 A1 | 10/2003 | Tomimatsu et al. |
| 2003/0215966 A1 | 11/2003 | Rolda et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 | 6/2005 | Hsu |
| 2005/0142033 A1 | 6/2005 | Glezer et al. |
| 2005/0151548 A1 | 7/2005 | Hayden et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0172703 A1 | 8/2005 | Kley |
| 2005/0174191 A1 | 8/2005 | Brunker et al. |
| 2005/0178980 A1 | 8/2005 | Skidmore et al. |
| 2005/0179444 A1 | 8/2005 | Tiemeijer |
| 2005/0195124 A1 | 9/2005 | Puente Baliarda et al. |
| 2005/0229053 A1 | 10/2005 | Sunter |
| 2005/0236587 A1 | 10/2005 | Kodama et al. |
| 2005/0237102 A1 | 10/2005 | Tanaka |
| 2006/0030060 A1 | 2/2006 | Noguchi et al. |
| 2006/0052075 A1 | 3/2006 | Galivanche et al. |
| 2006/0155270 A1 | 7/2006 | Hancock et al. |
| 2006/0184041 A1 | 8/2006 | Andrews et al. |
| 2006/0220663 A1 | 10/2006 | Oikawa |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| CN | 1083975 | 3/1994 |
| DE | 2951072 | 7/1981 |
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19522774 | 1/1997 |
| DE | 19542955 | 5/1997 |
| DE | 19618717 | 1/1998 |
| DE | 19749687 | 5/1998 |
| DE | 29809568 | 10/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53-037077 | 4/1978 |
| JP | 53037077 | 4/1978 |
| JP | 53-052354 | 5/1978 |
| JP | 55-115383 | 9/1980 |
| JP | 55115383 | 9/1980 |
| JP | 56-007439 | 1/1981 |
| JP | 56-88333 | 7/1981 |
| JP | 5691503 | 7/1981 |
| JP | 56088333 | 7/1981 |
| JP | 57-075480 | 5/1982 |
| JP | 57075480 | 5/1982 |
| JP | 57-163035 | 10/1982 |
| JP | 57163035 | 10/1982 |
| JP | 57171805 | 10/1982 |
| JP | 58-130602 | 8/1983 |
| JP | 594189 U | 1/1984 |
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62-098634 | 5/1987 |
| JP | 62-107937 | 5/1987 |
| JP | 62098634 | 5/1987 |
| JP | 62107937 | 5/1987 |
| JP | 62-179126 | 8/1987 |
| JP | 62-239050 | 10/1987 |
| JP | 62239050 | 10/1987 |
| JP | 62295374 | 12/1987 |
| JP | 63-108736 | 5/1988 |
| JP | 63-129640 | 6/1988 |
| JP | 63-143814 | 6/1988 |

| | | |
|---|---|---|
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-124469 | 5/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3-196206 | 8/1991 |
| JP | 3196206 | 8/1991 |
| JP | 3-228348 | 10/1991 |
| JP | 03228348 | 10/1991 |
| JP | 4-130639 | 5/1992 |
| JP | 04130639 | 5/1992 |
| JP | 4-159043 | 6/1992 |
| JP | 04159043 | 6/1992 |
| JP | 4-206930 | 7/1992 |
| JP | 04206930 | 7/1992 |
| JP | 4-340248 | 11/1992 |
| JP | 5-082631 | 4/1993 |
| JP | 05082631 | 4/1993 |
| JP | 5-113451 | 5/1993 |
| JP | 51-57790 | 6/1993 |
| JP | 5157790 | 6/1993 |
| JP | 51-66893 | 7/1993 |
| JP | 5166893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7-005078 | 1/1995 |
| JP | 7-12871 | 1/1995 |
| JP | 7005078 | 1/1995 |
| JP | 7012871 | 1/1995 |
| JP | 7-201945 | 8/1995 |
| JP | 8-35987 | 2/1996 |
| JP | 8035987 | 2/1996 |
| JP | 8-261898 | 10/1996 |
| JP | 8-330401 | 12/1996 |
| JP | 08330401 | 12/1996 |
| JP | 09127432 | 5/1997 |
| JP | 10-48256 | 2/1998 |
| JP | 10-116866 | 5/1998 |
| JP | 10116866 | 5/1998 |
| JP | 11-023975 | 1/1999 |
| JP | 11004001 | 1/1999 |
| JP | 11023975 | 1/1999 |
| JP | 2000-137120 | 5/2000 |
| JP | 2000-329664 | 11/2000 |
| JP | 2001-33633 | 2/2001 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002-243502 | 8/2002 |
| JP | 2002243502 | 8/2002 |
| JP | 2004-507851 | 3/2004 |
| KR | 2003/0090158 | 11/2003 |
| SU | 843040 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO98/07040 | 2/1998 |
| WO | WO00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn, Seymour B., "Optimum Design of Stepped Transmission-Line Transformers," I.R.E., Transactions—Microwave Theory and Techniques, No. 3, 1955, pp. 16-21.

Hopper, Samuel, "The Design of Ridged Waveguide," I.R.E. Transactions—Microwave Theory and techniques, No. 5, Oct. 1955, pp. 20-29.

Chen, Tsung-Shan, "Calculation of Parameters of Ridge Waveguides," IRE Transactions on Microwave Theory and Techniques, Jan. 1957, pp. 12-17.

IRE 20.1, Committee Personnel, "IRE Standards on Methods of Measuring Noise in Linear Twoports, 1959, " Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory, vol. CT-13, pp. 137-142, Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017..

Lane, Richard Q., "The Determination of Device Noise Parameters," Proc. IEEE, vol. 57, Aug. 1969, pp. 1461-1462.

Adamian, Vaheh, et al., "A Novel Procedure for Receiver Noise Characterization," IEEE Transactions on Instrumentation and Measurement, Jun. 1973.

Daly, P., "Polar Geomtry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19, No. 10, Mar. 1977.

Berg, William, et al., "Elastomers solve tough problems in high-frequency systems," 2119 EDN vol. 23, Jan. 5, 1978, pp. 36-42.

Eisenhart, R.L., "A Better Microstrip Connector," 1978 IEEE MTT-S International Microwave Symposium Digest, June 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al., "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts, Calibration & Check Devices, MT951, MT952, MT953 Series," Advanced Data 4T-002, Sep. 20, 1982, pp. 1-2.

Maury Microwave Corp., Transistor Test Fixture (TTF) Software, MT950D Series, Sep. 20, 1982, pp. 2 pages.

Maury Microwave Corp., "Transistor Test Fixture (TTF)," MT950 Series, Advaanced data 4T-001, Oct. 7, 1982.

Abbott, D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No.4, Apr. 1983, pp. 23-34.
Adamian, V. et al., "Simplified Noise Evaluation of Microwave Receiver," IEEE Transactions on Instrumentation and Measurement, vol. IM-33, No. 2, Jun. 1984, 136-140.
Pastori, William E., "High accuracy microwave noise figure measurements," 8029 Electronic Engineering 56, No. 1984, pp. 181-189.
Inter-Continental Microwave, "Product Catalog," VMC 1055 Jan. 1986.
Design Technique, "Microstrip Microwave Test Fixture," May 1986.
Cascade Microtech, Inc., "Wide Probe Assembly," Full Scale Drawing, May 29, 1986, 2 pages.
Jackson, Robert et al., "Surface-to-Surface Transition via Electromagnetic Coupling of Coplanar Waveguide," Nov. 1987, 8099 IEEE Transactions on Microwave Theory and Techniques MTT-35, pp. 1027-1032.
Sharma, A., "Tunable Waveguide-to-Microstrip Transition for Millimeter-Wave Applications," IEE MTT-S Digest 1987, pp. 353-356.
Izadin, Jamal S., "Unified Design Plans Aid Waveguide Transitions," Microwaves & R&F, May 1987, pp. 213-222.
Mazilu, T., "A Self-Adjusting Waveguide-to-Microstrip Transition," Microwave Journal, Jul. 1987, pp. 133-134.
Carlton, D.E. et al., "Accurate measurement of High-speed Package and Interconnect Parasitics," IEEE 1988 Custom Integrated Circuits Conference, pp. 23.3.1 - 23.3.6.
Fraser, Artur, et al., "GHz On-Silicon-Wafer Probing Calibration Methods," Paper 7.6, IEEE 1988 Bipolar Circuits & Technology Meeting, pp. 154-157.
Modolo, John A., et al, "Wafer level high-frequency measurements of photodetectors characteristics," Applied Optics, vol. 27 pages 3059-3061, Aug. 1988.
Design Technique, "Adjustable Test Fixture," 1988.
Tong, Peter R., et al., "Noise Measurements at MM-Wave Frequencies," 176 Microwave Journal 31, Jul. 1988.
Barsotti, C., et al., "New Probe Cards Replace Needle Types," Semiconductor International, Aug. 1988, pp. 98-101.
Microwave Journal, "Microwave Products," Sep. 1988, pp. 297.
Cascade Microtech Microprobe Update, "Spurious propagation, modes removed by probe absorber," Apr. 1989.
Estban, J., et al., "Mode Spectrum of Waveguides Using A Transverse S-Matrix Resonance Method," AP-S International Symposium 1989, IEEE Catalog No. CH-2654-2189, San Jose, CA, Jun. 26-30, 1989, pp. 1263-1267.
Ponchak, George, et al., "A New Rectangular Waveguide to Coplaner Waveguide Transition," Prepared for 1990 IEEE MTT-S International Microwave Symposium to be held between May 8-10, 1990 in Dallas, Texas, Jan. 1990.
Dalman. G.C., "New Waveguide-to-Coplaner Waveguide Transition for Centimetre and Millimetre Wave Applications," Electronics Letters, Jun. 21, 1990, vol. 26, No.13.
Cascade Microtech WPH-700 series, "Multicontact High-Speed Integrated Circuit," 1991, 700S-591.
Liu, S.M. Joseph, et al., "A New Probe for W-band On-wafer Measurements," IEEE MTT-S Digest, 1993, pp. 1335-1338.
Photo of Micromanipulator Probe Station, 1994.
Maury Microwave Corp., Transistor Test Fixture (TTF) MT950 Series, May 31, 1995, Advanced Data, 4T-0011.
Cascade Microtech, "Layout rules for WPH-900 Series probes," Applications Note, 1996.
Cascade Microtech, "Air coplanar Probe Series," 1997.
Yong-Dae, Kim, et al. "Fabrication of silicon Micro-Probe for Vertical Probe Card Application," Jpn. J. Appl. Phys. vol. 37, Part 1, No. 12B, Dec. 1998, pp. 7070-7073.
"A Broadband Microwave choke," Microwave Journal, Dec. 1999.
"The Air Coplanar Probe offers a highly complaiant, rugged probe with lowest insertion loss available," Cascade Microtech, Inc., Air coplanar Probe Series, 2000.
Cascade Microtech, "On-Wafer Test Solutions for State-of-the-Art Electro-Optical Components," 2001.

Purroy. F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.
"Laser Diode Test Solution," Oct. 9, 2002, http:/www.cascademicrotech.com/index.cfm/fuseaction/pg. view/pID/136.
Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.
Electrical Operation, Calibration and Measurement Steps with the HP 8510, At least one year prior to filing.
Cascade Microwave, "Introducing the World's First Microwave Wafer Probing Equipment," 4 pages, 1983.
Malm, R.L. "Reduction of Stray Fields About SEM Samples," IBM Technical Disclosure Bulletin, vol. 21, No. 7 Dec. 1978 2 pages.
Kuhn, Nick, "Accurate and Automatic Noise Figure Measurements with Standard Equipment," Hewlett-Packard co., Inc., Standford Park Division 1501 Page Mill Road, Palo Alto, CA 94304, 3 pages Conference: Technology Grow for the 80ZZZs. 1980 IEEE MTT-S International Microwave Symposium Digest, Washington, DC, May 28-30, 1980.
The micromanipular Company, data sheet, Double Sided Probing System, Jul. 2002, 2 pages.
International Search Report for PCT/US06/16238 mailed Feb. 28, 2007.
Written Opinion of the International Searching Authority for PCT/US06/16238, mailed Feb. 28, 2007.
Partial International Search Report for PCT/US2005/039561, mailed Mar. 21, 2006.
International Search Report for PCT/US2005/039561, mailed May 18, 2006.
Written Opinion of the International Searching Authority for PCT/US2005/039561, mailed May 18, 2006.
mark S. Boguski And Martin W. Mcintosh, "Biomedical Informatics," insight: review article, Nature 422, 233-237 (2003); doi:10.1038/nature01515.
L.L. Sohn, O.A. Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.
Sam Hanash, "insight review articles, Disease proteomics," Nature, vol. 422, Mar. 13, 2003, pp. 226 - 232.
Mike Tyers and Matthias Mann, "insight overview, From genomics to proteomics," Nature, vol. 422, Mar. 13, 2003, pp. 193 - 197.
Andrej Sali, Robert Glaser, Thomas Earnest, and Wolfgang Baumeister, "insight: review article From words to literature in structural proteomics," Nature 422, 216-225 (2003); doi: 10, 1038/nature01513.
Ruedi Aebersold and Matthias Mann, "insight review articles, Mass spectrometry-based proteomics," Nature, vol. 422, Mar. 13, 2003, pp. 198 - 207.
Barbara Marte, Senior Editor, "Nature insight Proteomics," Nature vol. 422, Mar. 13, 2003 pp. 191 - 194.
Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.
Qingqing Liang, et al., "Accurate ac Transistor Characterization to 110 GHz Using a New Four-port Self-Calibrated Extraction Technique," IEEE, 2004 Topical Meeting on Sillicon Monolithic Integrated Circuits in RF Systems, pp. 282 - 285.
Frances Purroy and Lluis Pradell, "New Theoretical Analysis of the LRRM Calibration Techinque for Vector Network Analyzers," IEEE Transactions on Instrumentation and Measurement, vol. 50 No. 5, Oct. 2001, pp. 1307-1313.
Christophe Risacher, et al., "Waveguide-to-microstrip Transition With Integrated Bias-T," IEEE Microwave and Wireless Components Letters, vol. 13, No. 7, Jul. 2003, pp. 262 - 264.
Saswata Basu and Leonard Hayden, "An SOLR Calibration for Accurate Measurement of Orthogonal On-Wafer DUTS," 1997 IEEE MTT-S Digest, pp. 1335 - 1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424 - 1428.

Mohammed Nurul Afsar, James R. Birch, and R. N. Clarke, "The Measurement of the Properties of Materials," Proceedings of the IEEE, vol. 747, No. 1, Jan. 1986, pp. 183 - 199.

M.S. Venkatesh and G.S.V. Raghavan, "An overview of dielectric properties measuring techniques," vol. 47, 2005, Canadian Biosystems Egineering,ZZZ pp. 7.15 - 7.30.

Andrzej W. Kraszewski, Stuart O. Nelson, and Tian-Su You, "Use of a Microwave Cavity for Sensing Dielectric Properties of Arbitrarily Shaped Biolgical Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL-A New concept in Microwave Measurements: Theory and Experimental verification," IEEE Transactions On Microwave Theory and Techniques, vol. 46, No. 5, May 1998, pp. 536-542.

Roberto Tinti, Franz Sischika, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, And Daniel E. Prober, "Optical antenna: towards a unity efficiency near-field optical probe," Appl. Phys. Lett. 70 (11), mar. 17, 1997, 1997 American Insitute of Physics, pp. 1354 - 1356.

Cascade Microtech, "Probe Heads Care and cleaning of coaxial input microwave probes," Microwave Probe Care and Cleaning, Instruction Manual, Copyright 1990.

Bob Stengel, "Neutralized Differential Amplifiers using Mixed-Mode s-parameters," 2003 IEEE Radio Frequency Integrated Circuits Symposium, pp. 711-714.

* cited by examiner

SHIELDED PROBE FOR TESTING A DEVICE UNDER TEST

CROSS-REFERENCE TO RELATED APPLICATIONS

This application is a continuation of U.S. patent application Ser. No. 11/607,398, filed Dec. 1, 2006, now U.S. Pat. No. 7,304,488; which is a continuation of U.S. patent application Ser. No. 10/848,777, filed May 18, 2004, now U.S. Pat. No. 7,161,363, which is a continuation of U.S. patent application Ser. No. 10/445,099, filed May 23, 2003, now U.S. Pat. No. 6,815,963, which claims the benefit of U.S. Provisional App. No. 60/383,017, filed May 23, 2002.

BACKGROUND OF THE INVENTION

The present invention relates to probe measurement systems for measuring the electrical characteristics of integrated circuits or other microelectronic devices at high frequencies.

There are many types of probing assemblies that have been developed for the measurement of integrated circuits and other forms of microelectronic devices. One representative type of assembly uses a circuit card on which the upper side are formed elongate conductive traces that serve as signal and ground lines. A central opening is formed in the card, and a needle-like probe tip is attached to the end of each signal trace adjacent the opening so that a radially extending array of downwardly converging needle-like tips is presented by the assembly for selective connection with the closely spaced pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

In order to obtain device measurements at somewhat higher frequencies than are possible with the basic probe card system described above, various related probing systems have been developed. Such systems are shown, for example, in Evans U.S. Pat. No. 3,849,728; Kikuchi Japanese Publication No. 1-209,380; Sang et al. U.S. Pat. No. 4,749,942; Lao et al. U.S. Pat. No. 4,593,243; and Shahriary U.S. Pat. No. 4,727,319. Yet another related system is shown in Kawanabe Japanese Publication No. 60-223,138 which describes a probe assembly having needle-like tips where the tips extend from a coaxial cable-like structure instead of a probe card. A common feature of each of these systems is that the length of the isolated portion of each needle-like probe tip is limited to the region immediately surrounding the device-under-test in order to minimize the region of discontinuity and the amount of inductive loss. However, this approach has resulted in only limited improvement in higher frequency performance due to various practical limitations in the construction of these types of probes. In Lao et al., for example, the length of each needle-like tip is minimized by using a wide conductive blade to span the distance between each tip and the supporting probe card, and these blades, in turn, are designed to be arranged relative to each other so as to form transmission line structures of stripline type. As a practical matter, however, it is difficult to join the thin vertical edge of each blade to the corresponding trace on the card while maintaining precisely the appropriate amount of face-to-face spacing between the blades and precisely the correct pitch between the ends of the needle-like probe tips.

One type of probing assembly that is capable of providing a controlled-impedance low-loss path between its input terminal and the probe tips is shown in Lockwood et al. U.S. Pat. No. 4,697,143. In Lockwood et al., a ground-signal-ground arrangement of strip-like conductive traces is formed on the underside of an alumina substrate so as to form a coplanar transmission line on the substrate. At one end, each associated pair of ground traces and the corresponding interposed signal trace are connected to the outer conductor and the center conductor, respectively, of a coaxial cable connector. At the other end of these traces, areas of wear-resistant conductive material are provided in order to reliably establish electrical connection with the respective pads of the device to be tested. Layers of ferrite-containing microwave absorbing material are mounted about the substrate to absorb spurious microwave energy over a major portion of the length of each ground-signal-ground trace pattern. In accordance with this type of construction, a controlled high-frequency impedance (e.g., 50 ohms) can be presented at the probe tips to the device under test, and broadband signals that are within the range, for example, of DC to 18 gigahertz can travel with little loss from one end of the probe assembly to another along the coplanar transmission line formed by each ground-signal-ground trace pattern. The probing assembly shown in Lockwood et al. fails to provide satisfactory electrical performance at higher microwave frequencies and there is a need in microwave probing technology for compliance to adjust for uneven probing pads.

To achieve improved spatial conformance between the tip conductors of a probe and an array of non-planar device pads or surfaces, several high-frequency probing assemblies have been developed. Such assemblies are described, for example, in Drake et al. U.S. Pat. No. 4,894,612; Coberly et al. U.S. Pat. No. 4,116,523; and Boll et al. U.S. Pat. No. 4,871,964. The Drake et al. probing assembly includes a substrate on the underside of which are formed a plurality of conductive traces which collectively form a coplanar transmission line. However, in one embodiment shown in Drake et al., the tip end of the substrate is notched so that each trace extends to the end of a separate tooth and the substrate is made of moderately flexible nonceramic material. The moderately flexible substrate permits, at least to a limited extent, independent flexure of each tooth relative to the other teeth so as to enable spatial conformance of the trace ends to slightly non-planar contact surfaces on a device-under-test. However, the Drake et al. probing assembly has insufficient performance at high frequencies.

With respect to the probing assembly shown in Boll et al., as cited above, the ground conductors comprise a pair of leaf-spring members the rear portions of which are received into diametrically opposite slots formed on the end of a miniature coaxial cable for electrical connection with the cylindrical outer conductor of that cable. The center conductor of the cable is extended beyond the end of the cable (i.e., as defined by the ends of the outer conductor and the inner dielectric) and is gradually tapered to form a pin-like member having a rounded point. In accordance with this construction, the pin-like extension of the center conductor is disposed in spaced apart generally centered position between the respective forward portions of the leaf-spring members and thereby forms, in combination with these leaf-spring members, a rough approximation to a ground-signal-ground coplanar transmission line structure. The advantage of this particular construction is that the pin-like extension of the cable's center conductor and the respective forward portions of the leaf-spring members are each movable independently of each other so that the ends of these respective members are able to establish spatially conforming contact with any non-planar contact areas on a device being tested. On the other hand, the transverse-spacing between the pin-like member and the respective leaf-spring members will vary depending on how forcefully the ends of these members are urged against the contact pads of the device-under-test. In other words, the transmission characteristic of this probing structure, which is dependent on the spacing between the respective tip members, will vary in an ill-defined manner during each probing cycle, especially at high microwave frequencies.

Burr et al., U.S. Pat. No. 5,565,788, disclose a microwave probe that includes a supporting section of a coaxial cable including an inner conductor coaxially surrounded by an outer conductor. A tip section of the microwave probe includes a central signal conductor and one or more ground conductors generally arranged normally in parallel relationship to each other along a common plane with the central signal conductor so as to form a controlled impedance structure. The signal conductor is electrically connected to the inner conductor and the ground conductors are electrically connected to the outer conductor, as shown in FIG. 1. A shield member is interconnected to the ground conductors and covers at least a portion of the signal conductor on the bottom side of the tip section. The shield member is tapered toward the tips with an opening for the tips of the conductive fingers. The signal conductor and the ground conductors each have an end portion extending beyond the shield member and the end portions are able to resiliently flex, despite the presence of the shielding member, relative to each other and away from their common plane so as to permit probing devices having non-planar surfaces.

In another embodiment, Burr et al. disclose a microwave probe that includes a supporting section of a coaxial cable including an inner conductor coaxially surrounded by an outer conductor, as shown in FIGS. 2A, 2B, and 2C. A tip section of the microwave probe includes a signal line extending along the top side of a dielectric substrate connecting a probe finger with the inner conductor. A metallic shield may be affixed to the underside of the dielectric substrate and is electrically coupled to the outer metallic conductor. Ground-connected fingers are placed adjacent the signal line conductors and are connected to the metallic shield by way of vias through the dielectric substrate. The signal conductor is electrically connected to the inner conductor and the ground plane is electrically connected to the outer conductor. The signal conductor and the ground conductor fingers (connected to the shield via vias) each have an end portion extending beyond the shield member and the end portions are able to resiliently flex, despite the presence of the shielding member, relative to each other and away from their common plane so as to permit probing devices having non-planar surfaces. While the structures disclosed by Burr et al. are intended to provide uniform results of a wide frequency range, they unfortunately tend to have non-uniform response characteristics at high microwave frequencies.

DETAILED DESCRIPTION OF PREFERRED EMBODIMENT

The present inventors considered the co-planar fingered probing devices disclosed by Burr et al., including the co-planar finger configuration and the microstrip configuration with fingers extending therefrom. In both cases, electromagnetic fields are created during probing between the fingers. These electromagnetic fields encircle each of the fingers, electrically couple the signal finger to the ground fingers, and electrically couple the ground fingers one another. While the probing device is being used for probing, the resulting electromagnetic fields surrounding the fingers interact with the wafer environment. While probing in different regions of the wafer, the interaction between the electromagnetic fields around the fingers and the wafer change, typically in an unknown manner. With a significant unknown change in the interaction it is difficult, if not impossible, to accurately calibrate out the environmental conditions while probing a device under test.

When multiple probes are being simultaneously used for probing the same area of the wafer, the probe tips come into close proximity with one another and result in additional coupling between the probes, normally referred to as cross-talk. In addition, the region between the support for the fingers, such as a dielectric substrate, and the extended portion of the fingers results in a significant capacitance, which impedes high frequency measurements.

The present inventors were surprised to determine that the microstrip structure disclosed by Burr et al. further does not calibrate well on calibration test substrates at very high frequencies, such as in excess of 70 GHz. This calibration is independent of potential interaction with a wafer at a later time during actual probing of a device under test. After examination of this unexpected non-calibration effect the present inventors speculate that an energy is created in an "undesired mode", other than the dominant field modes, at such extreme frequencies. This "undesired mode" results in unexpected current leakages from the signal path thus degrading the signal integrity. The present inventors further speculate that this "undesired mode" involves resonating energy in the ground plane as a result of discontinuities in the ground path, including for example, the connection between the ground plane and the external portion of the cable, and the inductance in the ground plane. This ground plane resonant energy results in unpredictable changing of the energy in the signal path to the device under test, thus degrading performance. This degradation wasn't apparent at lower operating frequencies, so accordingly, there was no motivation to modify existing probe designs in order to eliminate or otherwise reduce its effects.

Figure 3:
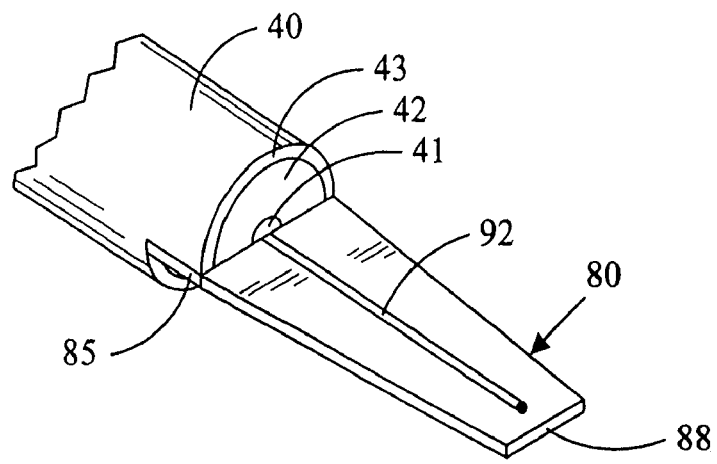
FIG. 3 illustrates a modified probe.

Referring to FIG. 3, a semi-rigid coaxial cable 40 is electrically connected at its rearward end to a connector (not shown). The coaxial cable 40 normally includes an inner conductor 41, a dielectric material 42, and an outer conductor 43. The coaxial cable 40 may likewise include other layers of materials, as desired. The forward end of the cable 40 preferably remains freely suspended and, in this condition, serves as a movable support for the probing end of the probe.

Figure 4:
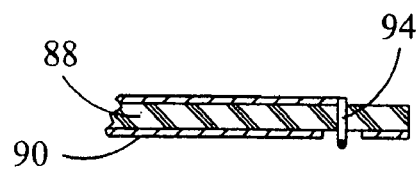
FIG. 4 illustrates a side view of a portion of the probe of FIG. 3.

A microstrip style probe tip 80 includes a dielectric substrate 88 that is affixed to the end of the coaxial cable 40. The underside of the cable 40 is cut away to form a shelf 85, and the dielectric substrate 88 is affixed to the shelf 85. Alternatively, the dielectric substrate 88 may be supported by an upwardly facing shelf cut away from the cable or the end of the cable without a shelf. Referring also to FIG. 4, a conductive shield 90, which is preferably planar in nature, is affixed to the bottom of the substrate 88. The conductive shield 90, may be for example, a thin conductive material (or otherwise) that is affixed to the substrate 88. By using a generally planar conductive material having a low profile the shield 90 is less likely to interfere with the ability to effectively probe a device under test by accidently contacting the device under test. The conductive shield 90 is electrically coupled to the outer conductor 43 to form a ground plane. The outer conductor 43 is typically connected to ground, though the outer conductor 43 may be provided with any suitable voltage potential (either DC or AC). The conductive shield 90 preferably covers all of the lower surface of the substrate 88. Alternatively, the conductive shield 90 may cover greater than 50%, 60%, 70%, 80%, 90%, and/or the region directly under a majority (or more) of the length of a conductive signal trace on the opposing side of the substrate 88.

One or more conductive signal traces 92 are supported by the upper surface of the substrate 88. The conductive traces 92, may be for example, deposited using any technique or otherwise supported by the upper surface of the substrate. The conductive trace(s) 92 is electrically interconnected to the inner conductor 41 of the coaxial cable 40. The inner conductor 41 of the coaxial cable 40 and the conductive trace(s) 92 normally carries the signal to and from the device under test. The conductive trace(s) 92 together with the shield layer 90 separated by a dielectric material 88 form one type of a microstrip transmission structure. Other layers above, below, and/or between the shield 90 and the conductive trace 92 may be included, if desired.

To reduce the effects of the aforementioned unexpected high frequency signal degradation, the present inventors determined that the signal path may include a conductive via 94 passing through the substrate 88. The conductive via 94 provides a manner of transferring the signal path from the upper surface of the substrate to the lower surface of the substrate. The conductive via 94 avoids the need for using a conductive finger extending out from the end of the substrate 88 that would otherwise result in a significant capacitance between the extended finger and the end of the substrate 88. The conductive via 94 provides a path from one side of the substrate 88 to the other side of the substrate 88 in a manner free from an air gap between the conductive via 94 and the substrate 84 for at least a majority of the thickness of the substrate 88. In addition, the shield layer 90 preferably extends beyond the via 94 to provide additional shielding.

Figure 5:
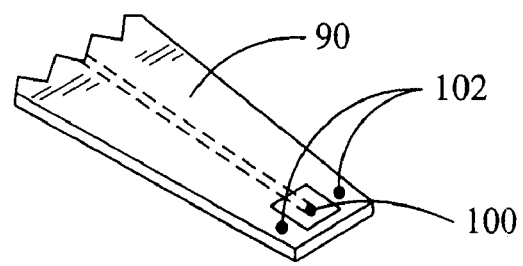
FIG. 5 illustrate a bottom view of a portion of the probe of FIG. 3.

Referring also to FIG. 5, the lower surface of the substrate 88 illustrates a contact bump 100 electrically connected to the via 94 and the trace 92 extending below the lower surface of the substrate 88 and the shield 90 which may be used to make contact with the device under test during probing. The conductive shield 90 may include an "patterned" section around the contact "bump" 100 so that the shield and the signal path are free from being electrically interconnected (e.g., the shield layer 90 may be greater than 50%, 75%, or laterally surrounding all of the contact at some point). It is to be understood that the contact may take any suitable form, such as a bump, a patterned structure, or an elongate conductor. The conductive shield 90 may laterally encircle the conductive bump which increases the resistance to external electromagnetic fields. Also, the conductive shield 90 extending beyond the conductive bump 100 reduces the crosstalk from other probes. For some probing applications, one or more shield contacts 102 may be provided, if desired. The shield layer and the conductive trace are normally constructed to provide a microstrip transmission line controlled impedance structure.

To further increase the performance at high frequencies the present inventors considered the effects of the substrate material. In many cases the dielectric constant of the dielectric substrate material is high, such as Al.sub.2O.sub.3 which has a 9.9 dielectric constant. Materials with a high dielectric constant have a tendency to concentrate the electromagnetic fields therein, thus decreasing the electromagnetic fields susceptible to influence by other devices. In addition, the thickness of the substrate is typically 250-500 microns to provide mechanical stability. Thus the fields tend to concentrate within the substrate.

Figure 13:
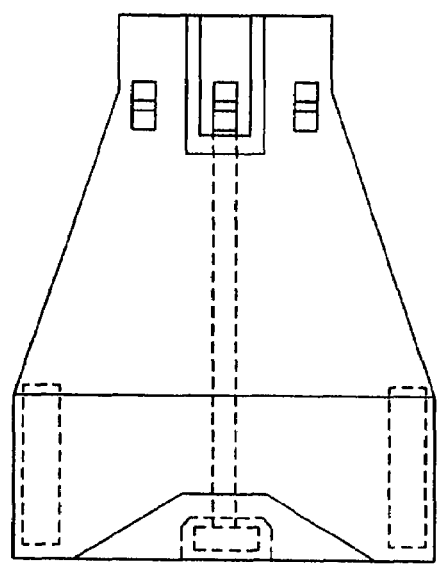
FIG. 13 illustrates a membrane type probe tip.
Figure 13:
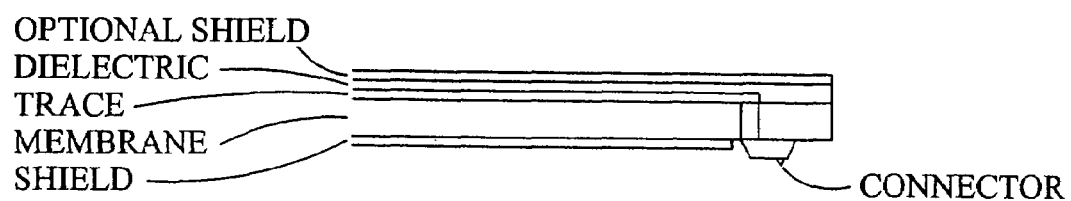

Referring to FIG. 13, while considering such substrates the present inventors came to the realization that the flexible membrane substrate may be substituted for the more rigid substrate 88. An example of membrane material is described in U.S. Pat. No. 5,914,613. In general, membrane based probes are characterized by a flexible (or semi-flexible) substrate with traces supported thereon together with contacting portions being supported thereon. The contacting portions come into contact with the device under test and the traces are normally on the opposing side of the membrane connected to the contacting portions using vias. In many cases, the membrane technology may be significantly thinner than ceramic based substrates, (see e.g., substrate 88) such as 40, 30, 20, 10, 5, or 3 microns or less. Normally the dielectric constant of the membrane material is 7 or less, sometimes less than 6, 5, or 4 depending on the particular material used. While normally using a lower dielectric constant substrate is unsuitable, using a significantly thinner substrate together with a lower dielectric constant substrate raises the theoretical frequency range of effective signal transmission to 100's of GHz. The significantly thinner substrate material permits positioning the lower shield material significantly closer to the signal traces than the relatively thick ceramic substrate, and therefore tends to more tightly confine the electromagnetic fields there between.

When the membrane based probe comes into contact with a device under test, as in most probes, it tends to skate across the pad as additional pressure is exerted. This skating is the result of the angled probe and/or co-axial cable flexing while under increasing pressure against the test pad. A limited amount of skating is useful to "scrub" away oxide layers, or otherwise, that may be built up on the contact pad, which results at least in part from a suitable amount of pressure and/or skating. In many cases the test pad is typically relatively small and excessive skating from slightly too much pressure being applied results in the probe simply skating off the test pad. In addition, if excessive pressure is exerted damage to the probe and/or contact pad may result. Accordingly, there is an acceptable range of pressure and skating that should be maintained.

Figure 6:
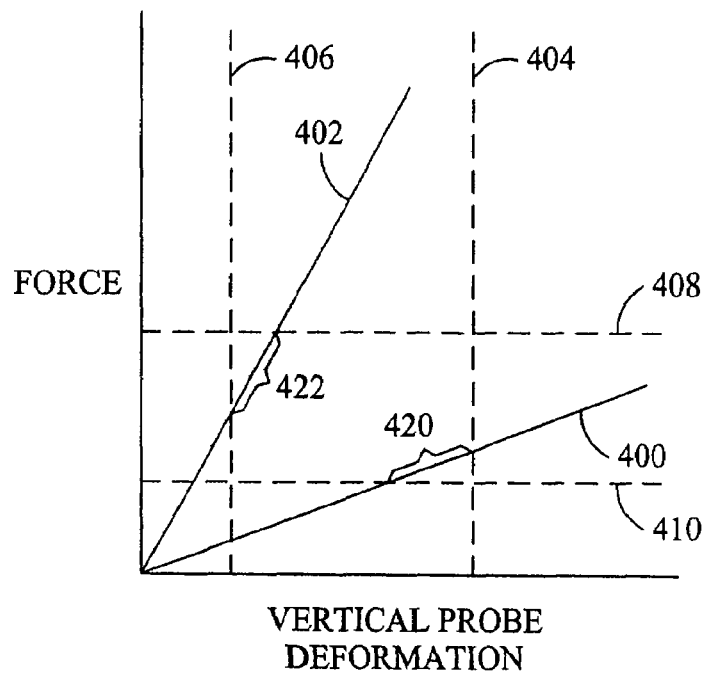
FIG. 6 illustrates a force versus vertical probe deformation graph.

Referring to FIG. 6, for purposes of illustration the force applied by the probe versus vertical deformation of the probe as a result of the force being applied is shown. Line 400 is for a low stiffness probe and line 402 is for a high stiffness probe. Vertical line 404 illustrates the maximum skating distance before the probe is likely off the contact pad, and accordingly the greatest distance of over travel of the probe after contact with the contact pad. Vertical line 406 illustrates the minimum generally acceptable skating distance of the probe to ensure sufficient scrubbing distance of the oxide layer or otherwise that may be built up on the contact pad, and accordingly the minimum generally acceptable distance of over travel of the probe after contact with the contact pad. Typically the range of useful over-travel is approximately 50 to 200 microns. Horizontal line 408 illustrates the maximum acceptable force that the probe may apply so that damage to the probe and/or contact pad is minimized. Horizontal line 410 illustrates the minimum acceptable force that the probe should apply so that sufficient pressure is exerted to break through the oxide layer or otherwise that may be built up on the contact pad.

It may be observed that there is a rectangular region (in this example) within which acceptable over-travel and force is applied by the probe to the contact pad. For the low stiffness probe 400 a range of 420 is shown where acceptable probing takes place. It may be observed that this distance uses less than the maximum range between vertical lines 404 and 406, and thus the over-travel must be carefully controlled by the operator. For the high stiffness probe 402 a range of 422 is shown where acceptable probing takes place. It may be observed that this distance uses less than the maximum range between vertical lines 404 and 406, and thus the over-travel must be carefully controlled by the operator. Accordingly, the stiffness of the probe needs to be carefully controlled, which is difficult, in order to establish an acceptable operating region. Further, it is noted that there is some relationship between skate to over-travel which may be controlled also. To little skate is problematic because some scrubbing action improved contact resistance and lateral motion provides visual confirmation (through the microscope) that contact has been made. To much skate is problematic because then the probe tip slides across and off the pad before getting enough force for good contact resistance. The pre-load provides the opportunity to tune that ratio by varying the curvatures of the probe and the pre-load location.

Figure 8:
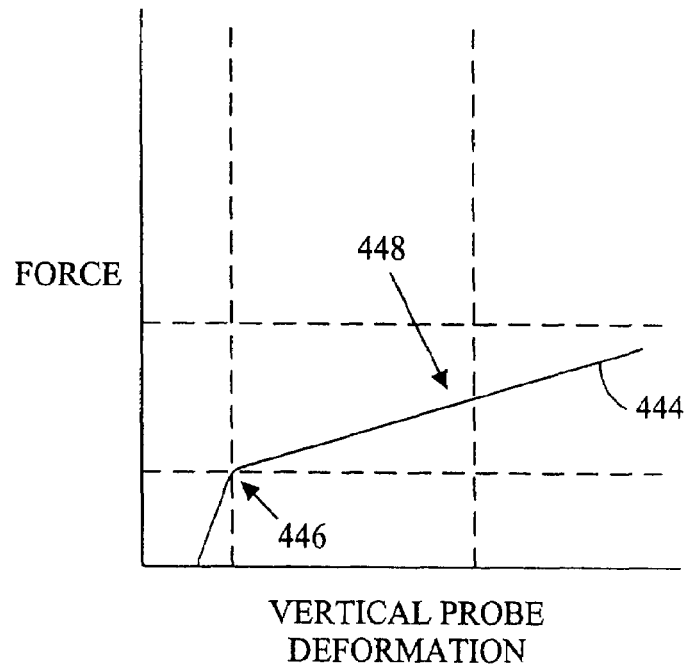
FIG. 8 illustrates a force versus vertical probe deformation graph for probe pre-loading.
Figure 7:
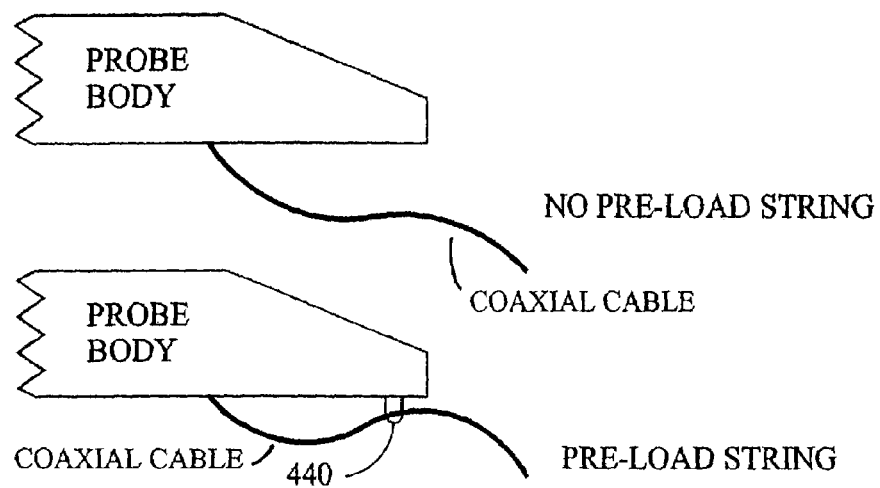
FIG. 7 illustrates probe pre-loading.

After consideration of the limitations seemingly inherent with the stiffness of the probe, the present inventors came to the realization that by using a relatively flexible probe together with pre-loading a portion of the force to be applied by that probe, a modified force-distance profile may be obtained that is more readily within the acceptable region. The modified force-distance profile may include more of the acceptable probing range, namely a wider probing range within the rectangular region, than otherwise achieved if the probe were not otherwise modified. Referring to FIG. 7, this pre-loading may be achieved by using a string 440 or other support member to upwardly flex the probe. If the low stiffness probe 400 is used, then a modified force profile 444 (see FIG. 8) may be obtained. It is noted that the lower curved portion 446 is as a result of the pre-loading of the probe. The upper portion 448 is a result of the probe itself and generally has the same force slope as the probe without pre-loading. It may be observed that in this manner a probe profile that has a relatively low slope that is suitable to extend across more of the useful probing range while maintaining reasonable forces may be used. The pre-loading raises the initial force to a range near the minimum generally acceptable force. The height of the profile 444 may be modified by adjusting the pre-loading.

Also, the slope of the profile 444 may be lessened by selecting a more flexible probe or otherwise modifying the orientation of the probe in relation to the contact pad. This pre-load system, while especially useful for membrane type probes, is likewise useful with other probing technologies.

Figure 9:
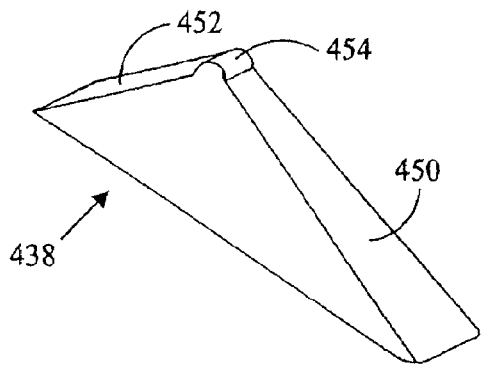
FIG. 9 illustrates a probe contact.

When making probing measurements the contact resistance between the probe and the device under test is an important consideration. The tip of the probe may be designed in such a manner as to achieve a low contact resistance while permitting effective viewing of the area to be probed with an associated microscope. The probe tip 438 (see FIG. 9) is typically constructed in such a manner that the resulting structure has a pair of opposing inclined surfaces 450 and 452. The tip 454 of the probe is preferably extended from the inclined surfaces 450 and 452. The construction of the probe tip may be done using a sacrificial substrate into which is created a depression. Into this depression is located conductive material, traces are located thereon if desired, and flexible dielectric material is located on or under the traces. See U.S. Pat. No. 5,914,613, incorporated herein by reference, together with all references cited herein. Thereafter the sacrificial substrate is removed leaving the probe tip, traces, and membrane material. The probe tip 438 is acceptable, however, it is difficult to see the region proximate the tip 438 when contacting the device under test because of the inclined surfaces 450 and 452.

Figure 10:
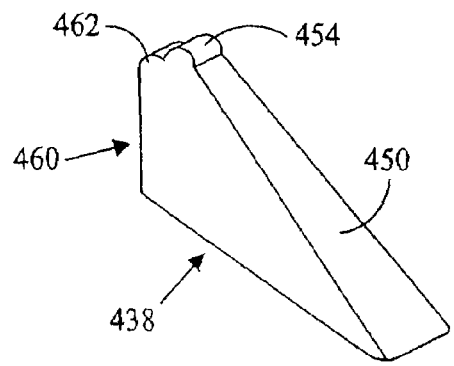
FIG. 10 illustrates a modified probe contact.
Figure 11:
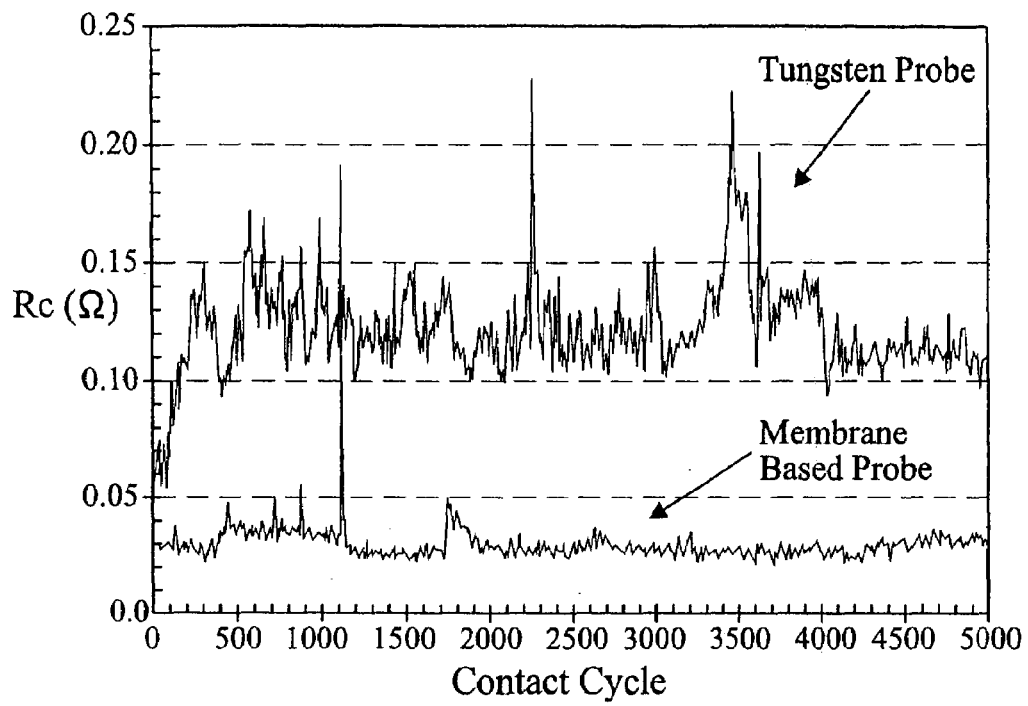
FIG. 11 illustrates contact resistance.

To improve the visibility of the tip 438 during probe it has been determined that the probe 454 may be ground back or otherwise a portion of the probe removed, as illustrated in FIG. 10. By removal of a portion of the probe a greater visibility may be achieved during probing of the device under test as illustrated in FIG. 10. It is also to be understood that the probe may be constructed in a manner such that a portion of the probe does not need to be removed. The tip portion 454 is preferably approximately 12.mu.m.times.12 .mu.m, with about 2-3 mills of vertical over-travel resulting in about 1 mil of longitudinal tip scrub. The probe may likewise retain a lip 460 that provides additional structural support for the tip 454. The backside 462 of the probe may even be undercut with respect to the plane of the base 464 of the probe. Alternatively, the backside 462 of the probe may be within 30 degrees of vertical (undercut or not) with respect to the plane of the base 464 of the probe.

Figure 1:
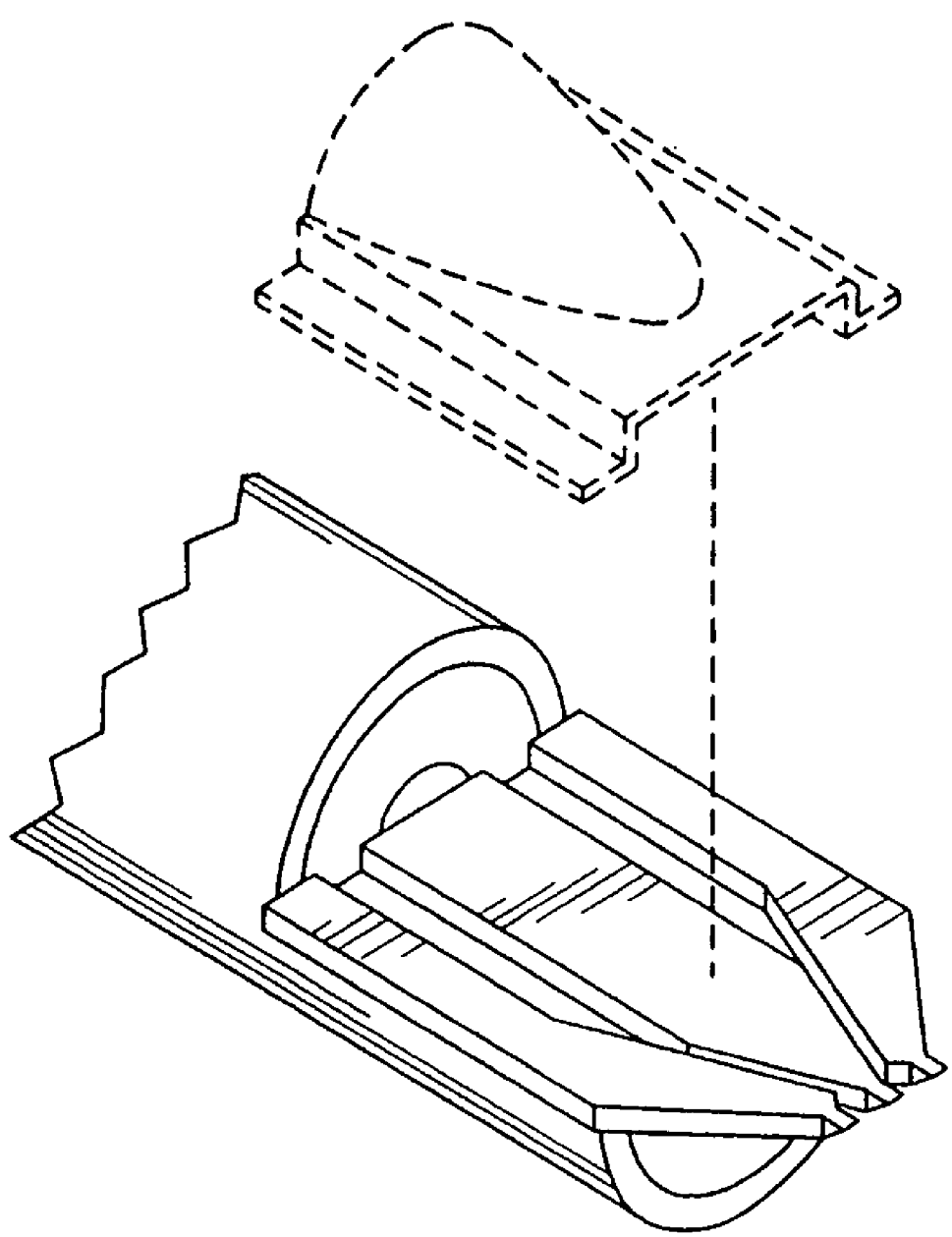
FIG. 1 illustrates an existing probe.
Figure 2A:
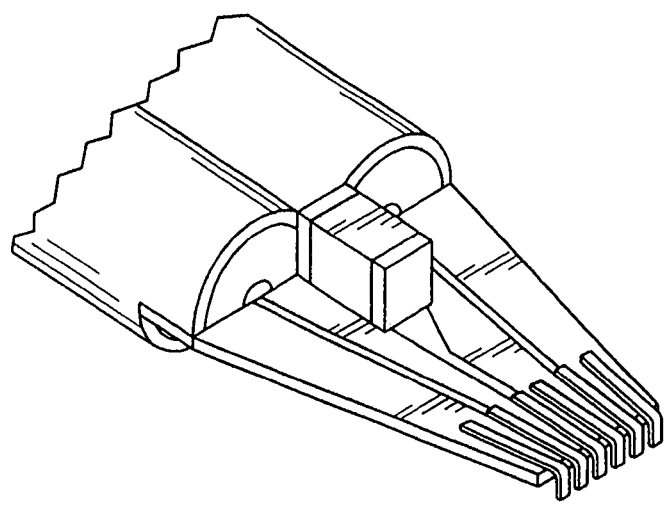
FIGS. 2A-2C illustrate an existing probe.
Figure 2B:
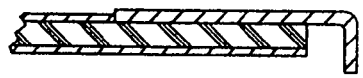
Figure 2C:
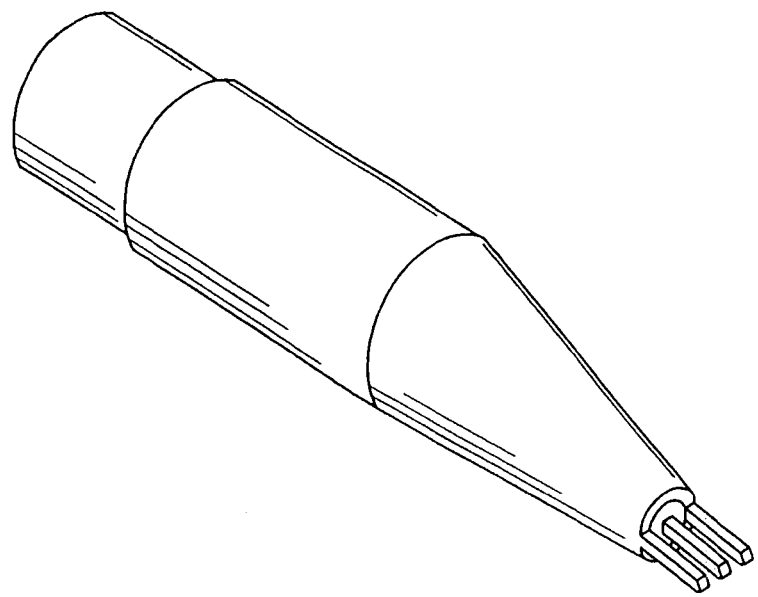
Figure 12:
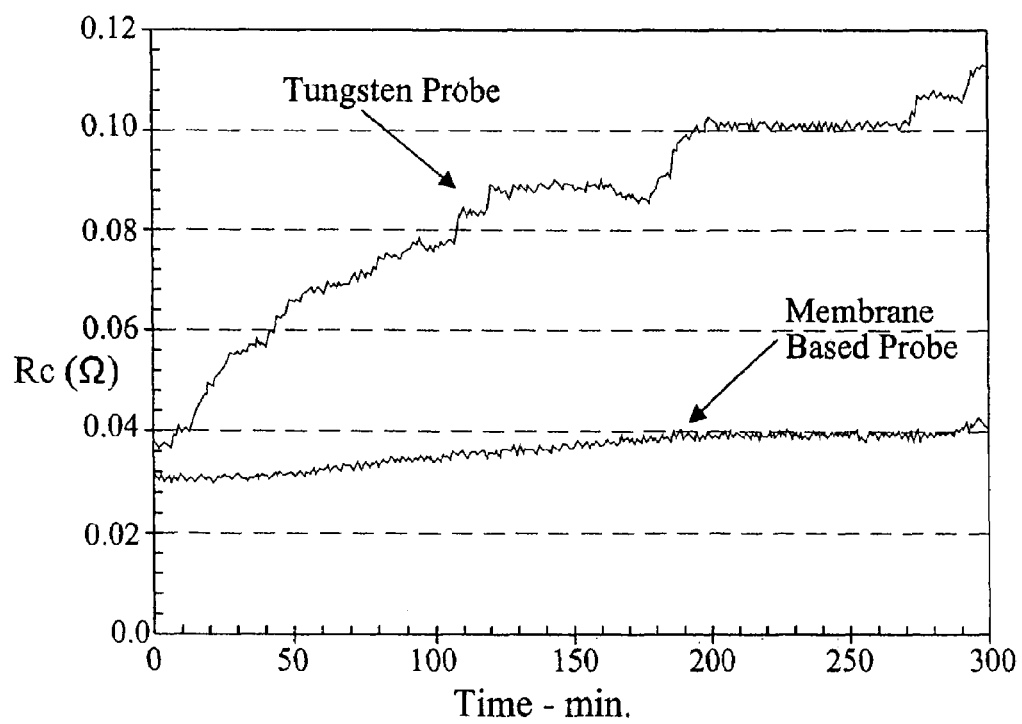
FIG. 12 illustrates contact resistance.

The contact resistance resulting from the described structure turns out to be exceedingly low, especially in comparison to other types of probing systems like Tungsten Probes. Referring to FIG. 1, the contact resistance on un-patterned aluminum is less then 30 m.OMEGA. over 5000 contact cycles, which is considerably lower than conventional tungsten probes where the contact resistance is approximately 130 m.OMEGA. Referring to FIG. 12, with the probe being held in contact with the aluminum pads the contact resistance is shown as a function of time. As illustrated in FIG. 12, only 10 m.OMEGA. of variation was observed during a 5-hour interval. In a similar test, conventional tungsten probes show significant changes over the same period, typically the contact resistance varies from 35 m.OMEGA. to 115 m.OMEGA.

Another consideration in the design of the probe is the characteristics of the different transmission structures. The coaxial cables provide good high frequency transmission characteristics. Within the membrane structure, connected to the coaxial cables, the micro-strip structure provides good high frequency characteristics. Connected to the membrane structure includes a set of contacts, such as a signal contact and a pair of ground contacts. The contacts provide a co-planar transmission structure which has less bandwidth capability than the coaxial cable and the micro-strip structure. To achieve acceptable bandwidth the present inventors have determined that the contacts should be no longer than 150 microns. More preferably the contacts should be no longer (e.g., height from planar surface) than 100 microns, or no longer than 75 microns, or no longer than 55 microns.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe comprising:
   (a) a dielectric substrate having a first side and a second side;
   (b) an elongate conductor suitable to be electrically interconnected to a first signal conductor and comprising a length portion supported by said first side of said substrate and a contact end portion projecting from said second side of said substrate; and
   (c) a conductive member suitable to be electrically interconnected to a second signal conductor and supported by said second side of said substrate, said conductive member having a first surface proximate said dielectric substrate and a second surface distal of said dielectric substrate and a dimension coextensive with at least a majority of the length portion of said elongate conductor, said second surface of said conductive member including a contact surface arranged substantially co-planar with and conductively isolated from said contact end portion of said elongate conductor for engagement with a device under test.

2. The probe of claim 1 wherein said substrate is in intimate contact with a portion of said elongate conductor for at least a majority of the thickness of said substrate.

3. The probe of claim 1 wherein said first signal conductor comprises a central conductor of a coaxial cable.

4. The probe of claim 3 wherein said second signal conductor comprises a conductor surrounding said central conductor of said coaxial cable.

5. The probe of claim 4 wherein said substrate is supported by said coaxial cable.

6. The probe of claim 5 wherein said substrate is supported by a shelf of said coaxial cable.

7. The probe of claim 1 wherein said conductive member is substantially planar.

8. The probe of claim 1 wherein said dielectric substrate is semi-flexible.

9. The probe of claim 8 wherein said dielectric substrate is a membrane.

10. The probe of claim 1 wherein said dielectric substrate has a dielectric constant less than 5.

11. The probe of claim 1 wherein said dielectric substrate has a dielectric constant less than 4.

12. The probe of claim 1 wherein said dielectric substrate has a dielectric constant less than 2.

13. The probe of claim 1 wherein said second signal conductor is connected to a ground signal of zero volts.

14. The probe of claim 1 wherein said conductive member covers greater than 50% of said second side of said substrate.

15. The probe of claim 1 wherein said conductive member covers greater than 60% of said second side of said substrate.

16. The probe of claim 1 wherein said conductive member covers greater than 70% of said second side of said substrate.

17. The probe of claim 1 wherein said conductive member covers greater than 80% of said second side of said substrate.

18. The probe of claim 1 wherein said conductive member covers greater than 90% of said second side of said substrate.

19. The probe of claim 1 wherein said conductive member, said elongate conductor, and said substrate collectively form a microstrip transmission structure.

20. The probe of claim 1 wherein said substrate has a thickness less than 40 microns and a dielectric constant less than 7.

21. The probe of claim 1 wherein said conductive member laterally surrounds at least 50% of a portion of said elongate conductor.

22. The probe of claim 1 wherein said conductive member laterally surrounds at least 75% of a portion of said elongate conductor.

23. The probe of claim 1 wherein said conductive member laterally surrounds at least 100% of a portion of said elongate conductor.

24. The probe of claim 1 wherein said contact end portion is in the form of a bump.

25. The probe of claim 1 wherein said contact end portion is in the form of a conductive finger.

26. The probe of claim 1 wherein said substrate has a thickness less than 30 microns.

27. The probe of claim 1 wherein said substrate has a thickness less than 20 microns.

28. A probe comprising:
   (a) a dielectric substrate supporting a first portion of an elongate conductor on a first side of said substrate and supporting a conductive member on a second side of said substrate wherein said conductive member has a dimension coextensive with at least a majority of a length of said first portion of said elongate conductor and comprises a first surface proximate said substrate and a second surface distal of said substrate, said second surface including a contact surface;
   (b) a contact conductively interconnected with said elongate conductor through said substrate and conductively isolated from said conductive member, said contact having an end portion arranged substantially co-planar with said contact surface.

29. The probe of claim 28 wherein a portion of said interconnection of said contact and said elongate conductor is in a region within the periphery of said substrate for at least a majority of the thickness of said substrate.

30. The probe of claim 28 wherein said elongate conductor is electrically interconnected to a central conductor of a coaxial cable.

31. The probe of claim 30 wherein said conductive member is electrically connected to a conductor surrounding said central conductor of said coaxial cable.

32. The probe of claim 28 wherein said dielectric substrate is flexible.

33. The probe of claim 32 wherein said dielectric substrate is a membrane.

34. The probe of claim 28 wherein said dielectric substrate has a dielectric constant less than 5.

35. The probe of claim 28 wherein said dielectric substrate has a dielectric constant less than 4.

36. The probe of claim 28 wherein said dielectric substrate has a dielectric constant less than 2.

37. The probe of claim 28 wherein said conductive member covers greater than 50% of said second side of said substrate.

38. The probe of claim 28 wherein said conductive member covers greater than 60% of said second side of said substrate.

39. The probe of claim 28 wherein said conductive member covers greater than 70% of said second side of said substrate.

40. The probe of claim 28 wherein said conductive member covers greater than 80% of said second side of said substrate.

41. The probe of claim 28 wherein said conductive member covers greater than 90% of said second side of said substrate.

42. The probe of claim 28 wherein said conductive member, said elongate conductor, and said substrate collectively form a microstrip transmission structure.

43. The probe of claim 28 wherein said substrate has a thickness less than 30 microns.

44. The probe of claim 28 wherein said substrate has a thickness less than 20 microns.

45. A probe comprising:
   (a) a dielectric substrate supporting an elongate conductor on a first side of said substrate and supporting a conductive member on a second side of said substrate, said conductive member having a first surface proximate said substrate and a second surface distal of said substrate;
   (b) a conductive path between said first side of said substrate and said second side of said substrate and interconnected with said elongate conductor;
   (c) said second surface of said conductive member including a contact surface for engaging a device under test;
   (d) a contact electrically interconnected to said conductive path for testing said device under test; and
   (e) a co-axial cable interconnected to said dielectric substrate, wherein said co-axial cable is maintained in a tensioned state when said contact surface and said contact are free from being engaged with said device under test.

46. The probe of claim 45 herein said substrate has a thickness of less than 40 microns with a dielectric constant of less than 7.

47. The probe of claim 45 wherein said conductive path is in a region within the periphery of said substrate for at least a majority of the thickness of said substrate.

48. The probe of claim 45 wherein said elongate conductor is electrically interconnected to a central conductor of said coaxial cable.

49. The probe of claim 45 wherein said conductive member is electrically connected to a conductor surrounding said central conductor of said coaxial cable.

50. A probe comprising:
   (a) a conductive member supported by a first side of a dielectric substrate and comprising a first surface proximate said dielectric substrate and a second surface distal of said substrate, said second surface including a contact surface; and
   (b) an elongate conductor including a first portion supported on a second side of said dielectric substrate and a contact end portion protruding proud of said first side of said dielectric substrate a distance less than 150 microns.

51. The probe of claim 50 wherein said contact end portion protrudes proud of said side of said dielectric substrate a distance less than 100 microns.

52. The probe of claim 50 wherein said contact end portion protrudes proud of said side of said dielectric substrate a distance less than 75 microns.

53. The probe of claim 50 wherein said contact end portion protrudes proud of said side of said dielectric substrate a distance less than 55 microns.

54. The probe of claim 50 further comprising a co-axial cable interconnected to said dielectric substrate, wherein said co-axial cable is maintained in a tensioned state when said contact is free from being engaged with said device under test.

55. The probe of claim 50 wherein said substrate has a thickness of less than 40 microns with a dielectric constant of less than 7.

* * * * *